(12) United States Patent
Hasegawa et al.

(10) Patent No.: US 8,861,659 B2
(45) Date of Patent: Oct. 14, 2014

(54) DATA RECEIVING CIRCUIT AND DATA RECEIVING METHOD

(71) Applicant: Lapis Semiconductor Co., Ltd., Tokyo (JP)

(72) Inventors: Hideaki Hasegawa, Tokyo (JP); Kouji Takeda, Oita (JP); Toshio Itou, Oita (JP); Yuuichi Ike, Oita (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/780,980

(22) Filed: Feb. 28, 2013

(65) Prior Publication Data

US 2013/0251077 A1    Sep. 26, 2013

(30) Foreign Application Priority Data

Mar. 26, 2012  (JP) ................. 2012-069681

(51) Int. Cl.
*H04L 27/08*     (2006.01)
*H03G 3/30*      (2006.01)
(52) U.S. Cl.
CPC .................... *H03G 3/3078* (2013.01)
USPC ..... 375/345; 375/324; 455/67.11; 455/226.2; 455/241.1; 455/245.1
(58) Field of Classification Search
USPC .......... 375/295–297, 318, 324, 345; 455/67.11, 115.1, 115.3, 116, 126, 455/226.1–226.2, 232.1, 234.1, 240.1, 455/241.1, 245.1, 253.2
See application file for complete search history.

(56) References Cited

U.S. PATENT DOCUMENTS

| | | | | |
|---|---|---|---|---|
| 6,625,433 | B1* | 9/2003 | Poirier et al. .............. | 455/232.1 |
| 2005/0130617 | A1* | 6/2005 | Burns et al. ................ | 455/253.2 |
| 2008/0070535 | A1* | 3/2008 | Liou .......................... | 455/232.1 |
| 2009/0163163 | A1* | 6/2009 | Itoh ............................ | 455/234.1 |
| 2011/0230156 | A1* | 9/2011 | Mehrmanesh et al. .... | 455/234.1 |

FOREIGN PATENT DOCUMENTS

JP    2008-124697    5/2008

* cited by examiner

*Primary Examiner* — Dac Ha
(74) *Attorney, Agent, or Firm* — Volentine & Whitt, PLLC

(57) ABSTRACT

A data receiving circuit and a data receiving method accurately acquire a data signal corresponding to information data from a high speed high density transmitted signal. An increase or a decrease of the level of one of a amplified data signal and a level converted data signal that is transmitted from one, referred to as one processing stage, of an amplification processing stage and a level converting processing stage, is fed back to a stage preceding the one processing stage. The amplification processing stage supplies, to a first line, an amplified data signal obtained by performing an amplification processing on a received data signal, and the level converting processing stage transmits, via a second line, a level converted data signal obtained by performing a level converting processing on the amplified data signal.

7 Claims, 12 Drawing Sheets

DATA RECEIVING CIRCUIT AND DATA RECEIVING METHOD

BACKGROUND OF THE INVENTION

1. Field of the Invention

The present invention relates to a data receiving circuit that performs various signal processings on a reception signal received through a transmission line and to a method for receiving data.

2. Description of the Related Art

In recent years, there are increasing demands for high speed and high density data transmission, and a differential transmission system is proposed as a data transmission system that can meet such demands.

In the differential transmission system, information data is converted to a pair of differential signals having polarities different from each other, and the differential signals are transmitted over balanced transmission lines. As a data receiving circuit for receiving such differential signals, there is a proposed circuit that includes a differential input stage for inputting a pair of received differential signals and a level converting stage for converting the levels of the signals inputted to the differential input stage to a level that is usable by logical circuits, wherein the level obtained by the level converting stage is outputted as a data signal. See, for example, FIG. 1 of Japanese Patent Application Laid-Open Publication No. 2008-124697. In this data receiving circuit, a pair of received differential signals (IN1, IN2) are supplied to the gate terminals of transistors M81 and M82 respectively of the differential input stage (M80 to M84), and signals obtained by amplifying a difference value between these differential signals (IN1, IN2) are supplied to the level converting stage (M85 to M88) via lines 3 and 4.

Meanwhile, dispersions of the driving power and the parasitic capacitance of the transistors that are caused by their manufacturing process may result in rounding or delay of the signal waveform in the data receiving circuit described above. In particular, if the amplitudes of the signals in the data receiving circuit exceed the value expected at the time of designing the circuit, it becomes difficult to perform high speed processing, which may in turn lead to the generation of an erroneous data signal.

SUMMARY OF THE INVENTION

The present invention has been made to solve the problem described above, and an object of the present invention is to provide a data receiving circuit and an amplitude control method that can accurately obtain a data signal corresponding to information data from a signal transmitted at high speed and high density.

According to a first aspect of the invention, a data receiving circuit comprises an amplification processing stage that supplies an amplified data signal on a first line, the amplified data signal being obtained by performing an amplification process on a received data signal, and a level converting processing stage that transmits a level converted data signal via a second line, the level converted data signal being obtained by performing a level conversion processing on the amplified data signal, wherein the data receiving circuit further comprises an amplitude controlling part that feeds back an increase or decrease of one of the amplified data signal and the level converted data signal transmitted from one of the amplification processing stage and the level converting processing stage to a stage preceding the aforementioned one of the amplification processing stage and the level converting processing stage.

According to another aspect of the invention, a data receiving method transmits a level converted data signal obtained by performing, at a level converting processing stage, a level conversion process on an amplified data signal obtained by performing, at an amplification processing stage, an amplification on a received data signal, wherein an increase or decrease of one of the amplified data signal and the level converted data signal is fed-back to a preceding stage.

According to the first aspect of the present invention, the increase or decrease of the one of the amplified data signal and the level converted data signal respectively transmitted by the amplification processing stage and the level converting processing stage is fed back to the stage preceding one of the amplification processing stage that performs the amplification processing on the received data signal to obtain the amplified data signal and supplies the obtained amplified data signal to the first line, and the level converting processing stage that performs the level converting processing on the amplified data signal to obtain the level converted data signal and transmits the obtained level converted data signal via the second line. Consequently, the lower the level of the data signal transmitted from the one of the amplification processing stage and the level converting processing stage, the higher the level of the data signal supplied to the one of the amplification processing stage and the level converting processing stage or the level of the received data signal. Accordingly, the larger the amplitude of an internal signal of the data receiving circuit, the greater the decrease of the amplitude as compared with the case where the feedback is not performed. In this way the amplitude of the internal signal can be limited to be equal to or lower than an upper limit amplitude that assures high speed operation. Therefore, even if the amplitude of the internal signal of the data receiving circuit is increased due to dispersions in the manufacturing process to be higher than the upper limit amplitude that can assure high speed operation, the amplitude can be suppressed to be lower than the upper limit amplitude, so that data signal corresponding to information data can be accurately acquired from a high speed and high density transmitted signal.

DETAILED DESCRIPTION OF THE PREFERRED EMBODIMENTS

A data reception circuit according to the embodiment feeds back a change (increase or decrease) in level of a data signal transmitted from a processing stage to a stage preceding a processing stage, the processing stage being one of an amplification processing stage that supplies an amplified data signal obtained by performing an amplification processing on a received data signal, and a level converting processing stage that transmits, via a second line, a level converted data signal obtained by performing a level converting processing on the amplified data signal.

Figure 1:
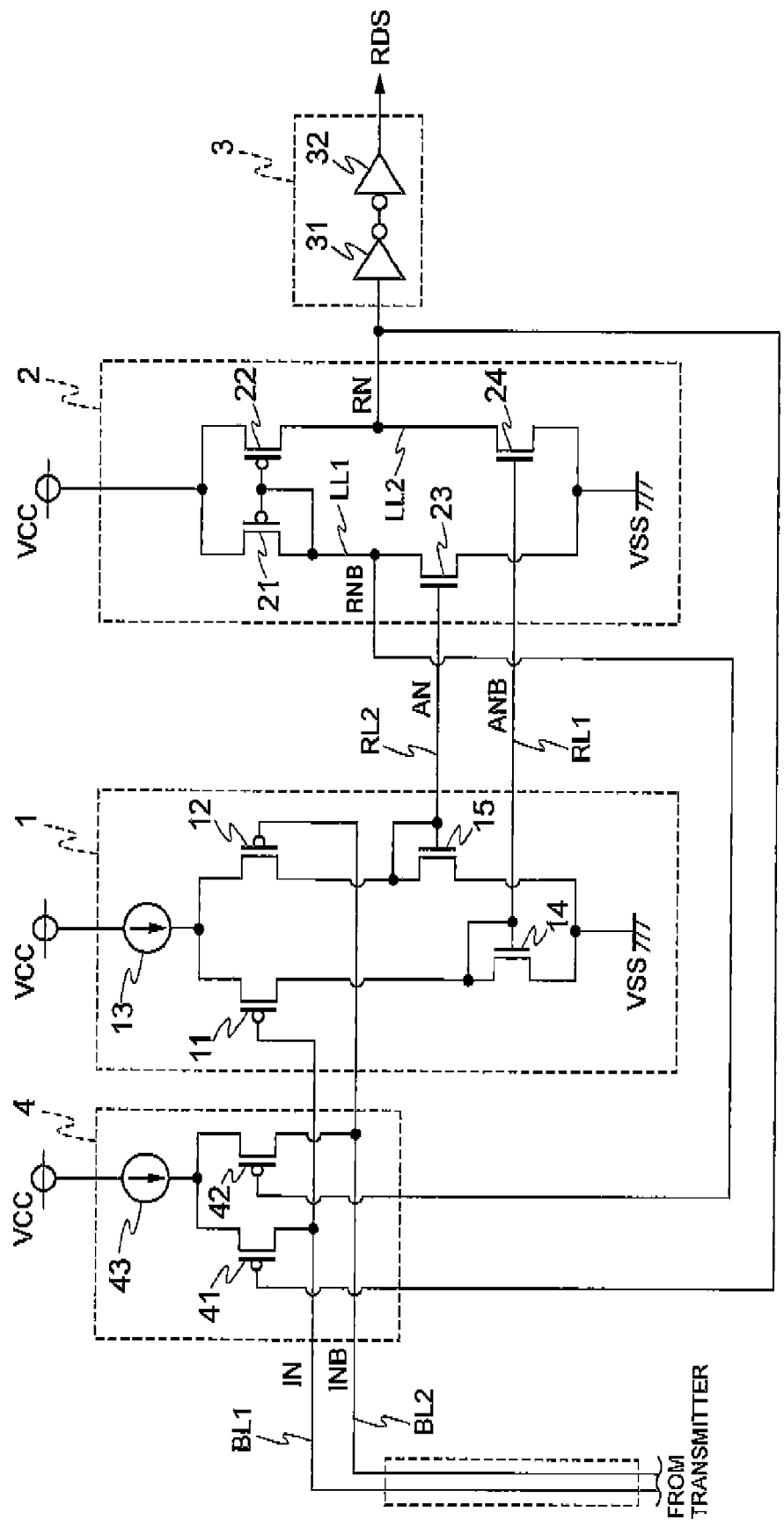
FIG. 1 is a circuit diagram showing an example of the data receiving circuit as an embodiment of the present invention.

FIG. 1 is a circuit diagram which illustrates an example of the configuration of a data receiving circuit of the embodiment.

As shown in FIG. 1, the data receiving circuit includes a differential amplification stage 1, a level converting stage 2, an outputting stage 3, and an amplitude controlling part 4. The data receiving circuit receives a pair of differential signals having different polarities, through balanced transmission lines BL1 and BL2 respectively. The pair of differential signals are generated by a transmitter (not shown in FIG. 1) based on information data to be transmitted. A pair of received differential signals IN and INB respectively received through the balanced transmission lines BL1 and BL2 are supplied to the gate terminals respectively of p-channel MOS (Metal Oxide Semiconductor) transistors 11 and 12 of the differential amplification stage 1. Based on a power supply voltage VCC, a constant current source 13 generates a predetermined constant current Ia which, in turn, is supplied to the source terminal of each of the transistors 11 and 12. The drain terminal of the transistor 11 is connected to the drain and gate terminals of an n-channel MOS transistor 14. A ground potential VSS is supplied to the source terminal of the n-channel MOS transistor 14 whose gate and drain terminals are further connected to the level converting stage 2 via a relay line RL1. The drain terminal of the transistor 12 is connected to the drain and gate terminals of an n-channel MOS transistor 15. The ground potential VSS is supplied to the source terminal of the n-channel MOS transistor 15, and whose gate and drain terminals are further connected to the level converting stage 2 via a relay line RL2.

The differential amplification stage 1 having the configuration described above supplies a differential amplified signal ANB, obtained by amplifying a signal corresponding to a level difference between the received differential signals IN and INB, to the level converting stage 2 through the relay line RL1. At the same time, the differential amplification stage 1 supplies a differential amplified signal AN, that is a phase-inverted signal of the differential amplified signal ANB, to the level converting stage 2 through the relay line RL2.

The level converting stage 2 includes p-channel MOS transistors 21 and 22 whose gate terminals are mutually connected, and the power supply voltage VCC is applied to the source terminal of each of the transistors 21 and 22. The gate and drain terminals of the transistor 21 are connected to the drain terminal of an n-channel MOS transistor 23 through the line LL1. The differential amplified signal AN from the differential amplification stage 1 is supplied to the gate terminal of the transistor 23 through the relay line RL2, and the ground potential VSS is applied to the source terminal of the transistor 23. The drain terminal of the transistor 22 is connected to the drain terminal of an n-channel MOS transistor 24 via the line LL2. The differential amplified signal ANB from the differential amplification stage 1 is supplied to the gate terminal of the transistor 24 through the relay line RL1, and the ground potential VSS is applied to the source terminal of the transistor 24.

The level converting stage 2 having the configuration described above produces, as a data signal RN, a signal obtained by a level conversion, within a range between the ground potential VSS and the power supply voltage VCC, of the amplitude of a signal corresponding to a difference between the differential amplified signals AN and ANB described above, and supplies the thus obtained data signal RN to the outputting stage 3 and the amplitude controlling part 4 through the line LL2 described above. The level converting stage 2 further supplies a data signal RNB, which is a phase-inverted signal of the data signal RN, to the amplitude controlling part 4 through the line LL1 described above.

The outputting stage 3 includes inverters 31 and 32 which are connected in series with each other, and outputs, as a received data signal RDS, a signal having a level that corresponds to a logical level "1" when the level of the data signal RN supplied through the line LL2 is equal to or higher than a threshold value, and to a logical level "0" when the level of the data signal RN is lower than the threshold value.

The amplitude controlling part 4 includes a p-channel MOS transistor 41 having the gate terminal, as a control terminal, to which the line LL2 of the level converting stage 2 is connected. The drain terminal of the transistor 41 is connected to the balanced transmission line BL1. Similarly, the line LL1 of the level converting stage 2 is connected to the gate terminal, as a control terminal, of a p-channel MOS transistor 42 of the amplitude controlling part 4, and the drain terminal of the transistor 42 is connected to the balanced transmission line BL2. Based on the power supply voltage VCC, the constant current source 43 generates the predetermined constant current Ib, and supplies it to the source terminal of each of the transistors 41 and 42.

In this configuration, the lower the level of the data signal RN generated by the level converting stage 2, the higher current the transistor 41 of the amplitude controlling part 4 supplies to the balanced transmission line BL1. Similarly, the lower the level of the data signal RNB generated by the level converting stage 2, the higher current the transistor 42 of the amplitude controlling part 4 supplies to the balanced transmission line BL2. Consequently, the lower the level of the data signal RN (RNB), the greater the rise of the level of the received differential signal IN (INB) supplied through the balanced transmission line BL1 (BL2). Since the amount of the level increase in a low-level section of the received differential signal IN (INB) becomes higher than in a high-level section of the received differential section, a difference between the signal level in the high level section and the signal level in the low level section, that is, the amplitude of the received differential signal IN (INB) becomes small. This will result in lowering of the amplitudes of the differential amplitude signal AN (ANB) and the data signal RN (RNB) generated based on the received differential signal IN (INB).

Briefly speaking, the amplitude controlling part 4 decreases the amplitude of the received differential signal IN (INB) by a control that the lower the level of the data signal RN (RNB), the higher the level of the received differential signal IN (INB). Thus, it can be realized that the amplitudes of the differential amplified signal AN (ANB) and the data signal RN (RNB) are limited to values under an upper limit of the amplitude value (hereinafter, referred to as "upper limit amplitude" which assures high-speed operation.

Figure 2:
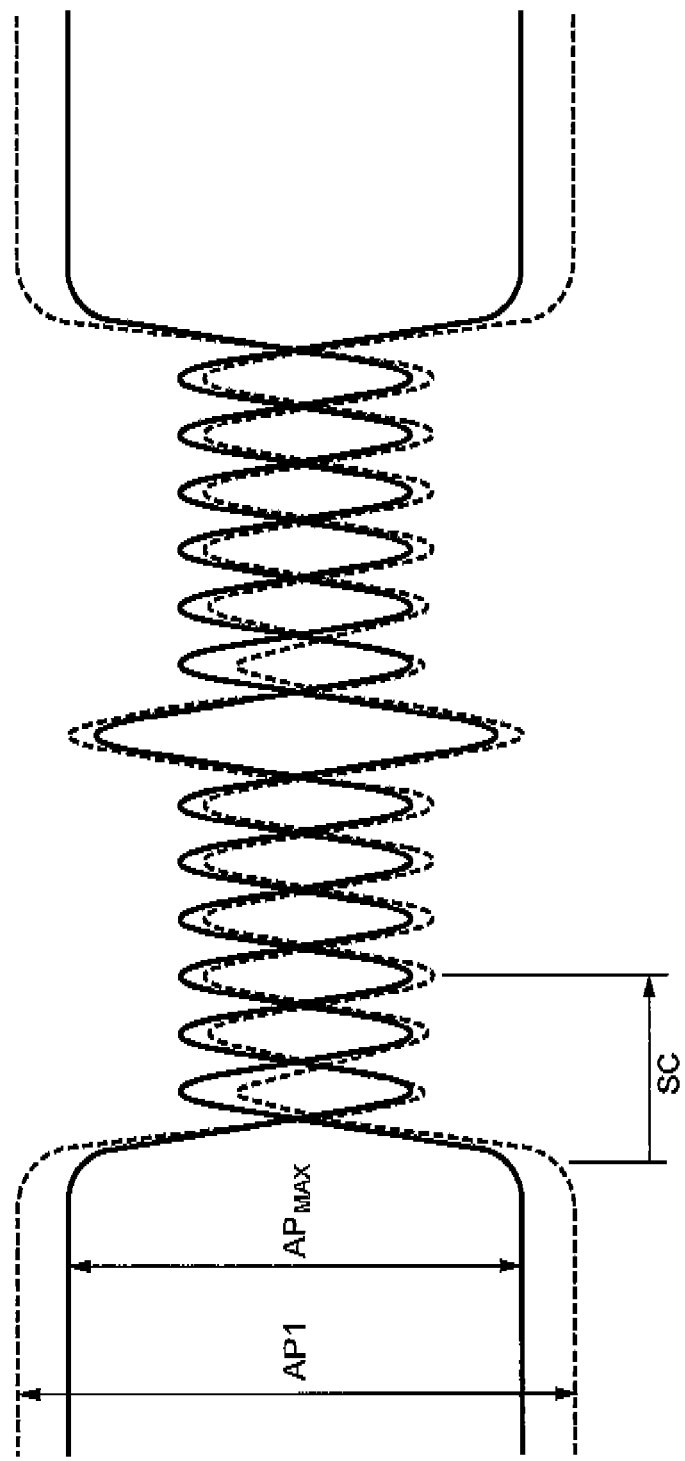
FIG. 2 is a waveform diagram showing an example of the waveform of a signal in the data receiving circuit.

FIG. 2 is a waveform diagram which comparatively shows an example of the waveform of the internal signal (AN, ANB, RN, RNB) obtained when the amplitude controlling part 4 is provided in the data receiving circuit (shown by the solid line), and an example of the waveform of the internal signal obtained when the amplitude controlling part 4 is not provided in the data receiving circuit (shown by the broken line).

The case where the amplitude controlling part 4 is not provided will be explained first. In a section in which the period of alternation of the internal signal (AN, ANB, RN, RNB) is relatively long, the internal signal (AN, ANB, RN, RNB) has an amplitude AP1 that is larger than an upper limit amplitude $AP_{MAX}$ as illustrated by the broken line in FIG. 2, under the influence like dispersion related to the manufacture of the transistors. Subsequently, when the internal signal has moved to a section in which the period of alternation of the internal signal is short, the amplitude of the signal becomes reduced, but a certain time period SC is required before the amplitude of the signal becomes stable after the period of alternation has been shortened, as illustrated by the broken line in FIG. 2. This is because the amplitude of the signal immediately before the shortening of the period, like the amplitude AP1, was larger than the upper limit amplitude $AP_{MAX}$.

On the other hand, when the amplitude controlling part 4 is provided, the amplitudes of the internal signals (AN, ANB, RN, RNB) are controlled to be on the upper limit amplitude $AP_{MAX}$ in the section in which the period of alternation of the internal signal is relatively long, as illustrated by the solid line in FIG. 2. When the internal signal has moved to the section in which the period of alternation of the internal signal is short, the amplitude of the signal swiftly becomes stable because the amplitude of the signal immediately before the shortening of the period was at the upper limit amplitude $AP_{MAX}$ which assures high-speed operation.

In this way, the amplitude of the signal in the data receiving circuit can be controlled within the upper limit amplitude by means of the amplitude controlling part 4 even if the amplitude of the signal is increased to be greater than the upper limit amplitude which can assure high-speed operation as a result, for example, of manufacturing dispersion. This allows an accurate acquisition of the data signal from high-speed and high-density received differential signals.

In the embodiment shown in FIG. 1, the amplitude limiting process based on the state of the data signal RN (RNB) is performed in the amplitude controlling part 4 by the direct connection between the line LL1 (LL2) of the level converting stage 2 and the gate terminal of the transistor 42 (41) of the amplitude controlling part 4. However, it is also possible to provide a delay circuit between the line LL1 (LL2) of the level converting stage 2 and the gate terminal of the transistor 42 (41) of the amplitude controlling part 4, so that the phase relationship of the amplitude limiting process based on the data signal RN (RNB) with respect to the received differential signal IN (INB) is made adjustable.

Figure 3:
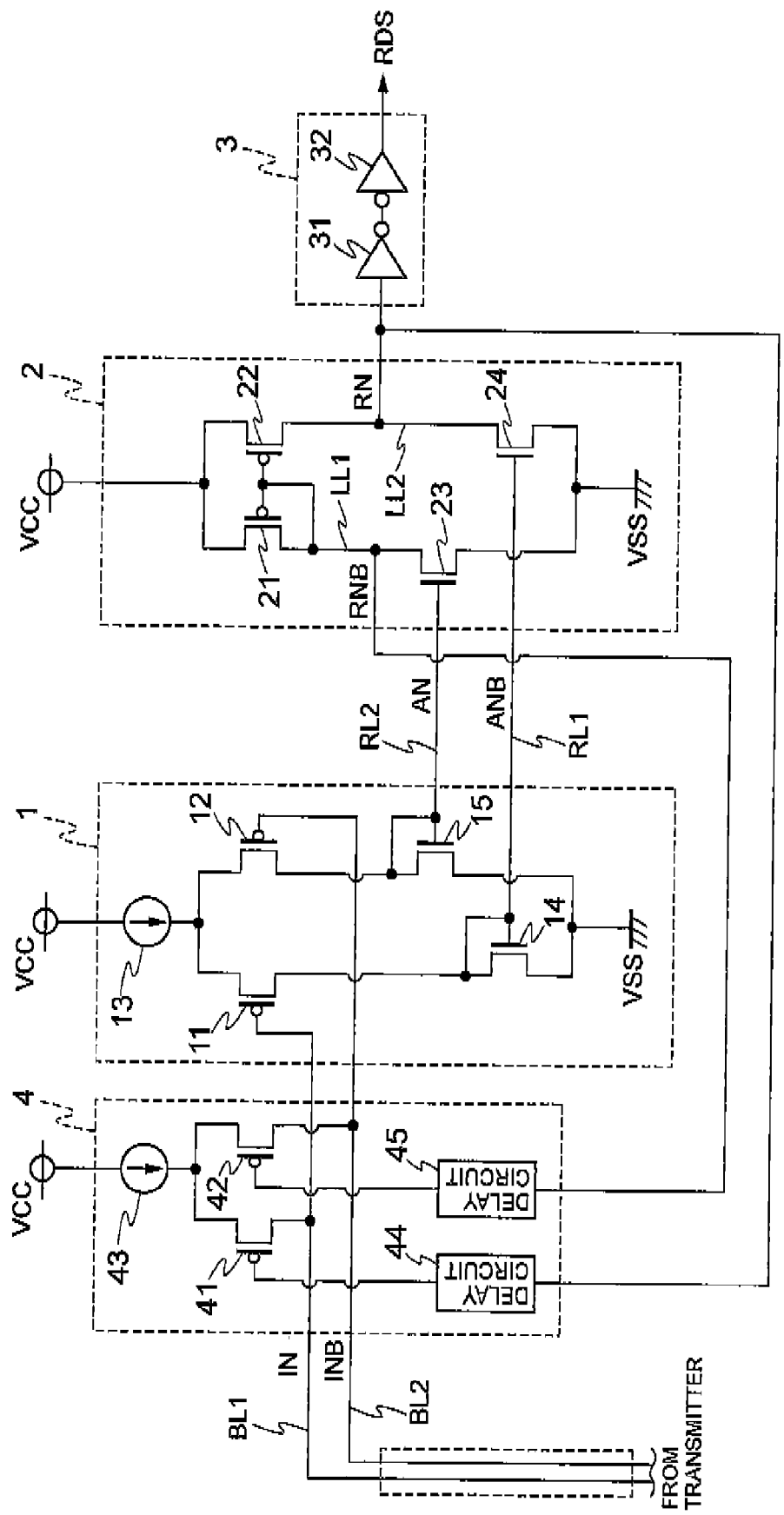
FIG. 3 is a circuit diagram showing a example of a modification of the data receiving circuit shown in FIG. 1.

FIG. 3 is a circuit diagram showing a modified embodiment configured in consideration of the point stated above.

The data receiving circuit shown in FIG. 3 is provided with a delay circuit 44 between the line LL2 of the level converting stage 2 and the gate terminal of the transistor 41 of the amplitude controlling part 4, and a delay circuits 45 between the line LL1 of the level converting stage 2 and the gate terminal of the transistor 42 of the amplitude controlling part 4. In other aspects, the circuit shown in FIG. 3 is identical with the circuit shown in FIG. 1.

In FIG. 3, the delay circuit 44 delays the data signal RN transmitted on the line LL2 of the level converting stage 2 by a predetermined delay time, and supplies the delayed signal to the gate terminal of the transistor 41 of the amplitude controlling part 4. Similarly, the delay circuit 45 delays the data signal RNB transmitted on the line LL1 of the level converting stage 2 by a predetermined delay time, and supplies the delayed signal to the gate terminal of the transistor 42 of the amplitude controlling part 4. The delay times respectively of the delay circuits 44 and 45 are selected to be shorter than a minimum period which the received differential signals IN and INB can have.

By the use of the delay circuits 44 and 45, it is possible to perform the amplitude limiting process based on the data signal RN (RNB) in a state that phase matching with the received differential signals IN and INB is being made. This allows an improvement in accuracy of the amplitude limiting process as compared with the configuration shown in FIG. 1.

In the embodiment shown in FIG. 1 or FIG. 3, the data signals RN and RNB are respectively supplied to the gate terminals of the transistors 41 and 42 of the amplitude controlling part 4. However, it is also possible to configure that the output signal of the inverter 31 of the outputting stage is supplied to the gate terminal of the transistor 42 instead of the data signal RN and the output signal of the inverter 32 of the outputting stage is supplied to the gate terminal of the transistor 41 instead of the data signal RNB.

In the embodiment shown in FIG. 1, the amplitude of the internal signal (AN, ANB, RN, and RNB) is decreased by the supply of currents according to the data signals RN and RNB by means of the amplitude controlling part 4. However, the circuit is not limited to this configuration.

Figure 4:
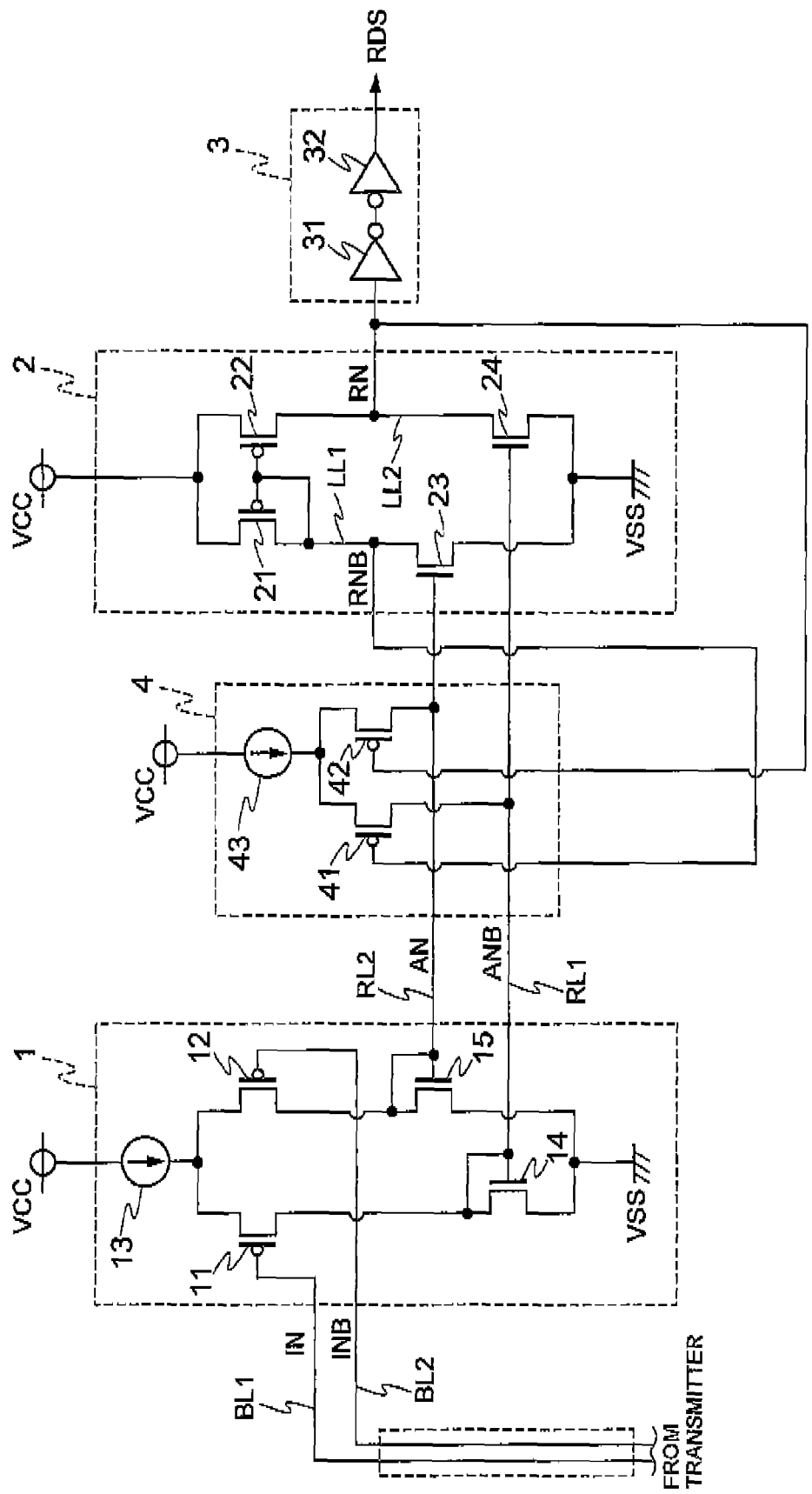
FIG. 4 is a circuit diagram showing another modification of the data receiving circuit shown in FIG. 1.

For example, the amplitude controlling part 4 which is positioned to precede the differential amplification stage 1 in FIG. 1 can be provided between the differential amplification stage 1 and the level converting stage 2 as illustrated in FIG. 4.

In the configuration shown in FIG. 4, the drain terminal of the transistor 41 of the amplitude controlling part 4 is connected to the relay line RL1 and the drain terminal of the transistor 42 of the amplitude controlling part 4 is connected to the relay line RL2. The other configuration portions are the same as those shown in FIG. 1.

The amplitude controlling part 4 shown in FIG. 4 supplies to the relay line (RL1, RL2) a current such that the lower the level of the data signal RN(RNB), the larger the current, so that the lower the level of the data signal RN (RNB), the greater the rise of the level of the differential amplitude signal AN (ANB), thereby to decrease the amplitude of the differential amplitude signal AN (ANB). As a result, like in the configuration shown in FIG. 1, the amplitudes of the differential amplitude signal AN (ANB) and the data signal RN (RNB) can be limited, in the configuration shown in FIG. 4, by the amplitude controlling part 4 to values equal to or lower than the upper limit amplitude $AP_{MAX}$ which assures high speed operation.

As in the configuration shown in FIG. 3, it is also possible to provide a delay circuit between the line LL1 (LL2) of the level converting stage 2 and the gate terminal of the transistor 42 (41) of the amplitude controlling part 4 in the configuration shown in FIG. 4.

Figure 5:
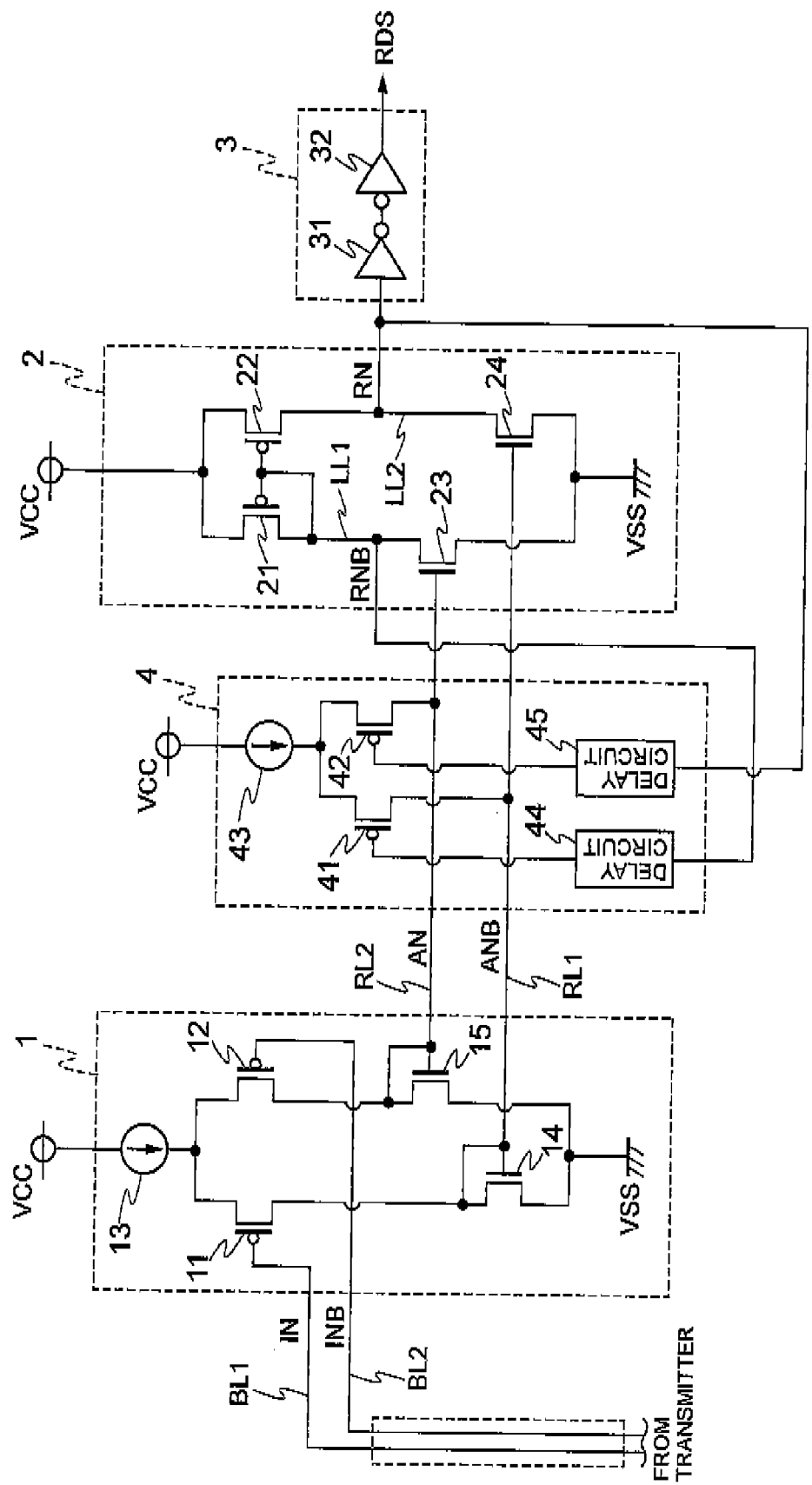
FIG. 5 is a circuit diagram showing a modification of the data receiving circuit shown in FIG. 4.

FIG. 5 is a circuit diagram showing a modification of the data receiving circuit shown in FIG. 3 implemented in view of the point described above.

The data receiving circuit shown in FIG. 5 is identical with that shown in FIG. 4 other than a point that the delay circuit 44 (45) is provided between the line LL1 (LL2) of the level converting stage 2 and the gate terminal of the transistor 42 (41) of the amplitude controlling part 4.

In the configuration shown in FIG. 1, the amplitude controlling part 4 supplies to the balanced transmission lines BL1 and BL2 the currents according to the data signals RN and RNB generated by the level converting stage 2. It is, however, also possible to supply currents corresponding to the differential amplified signals AN and ANB to the balanced transmission lines BL1 and BL2.

Figure 6:
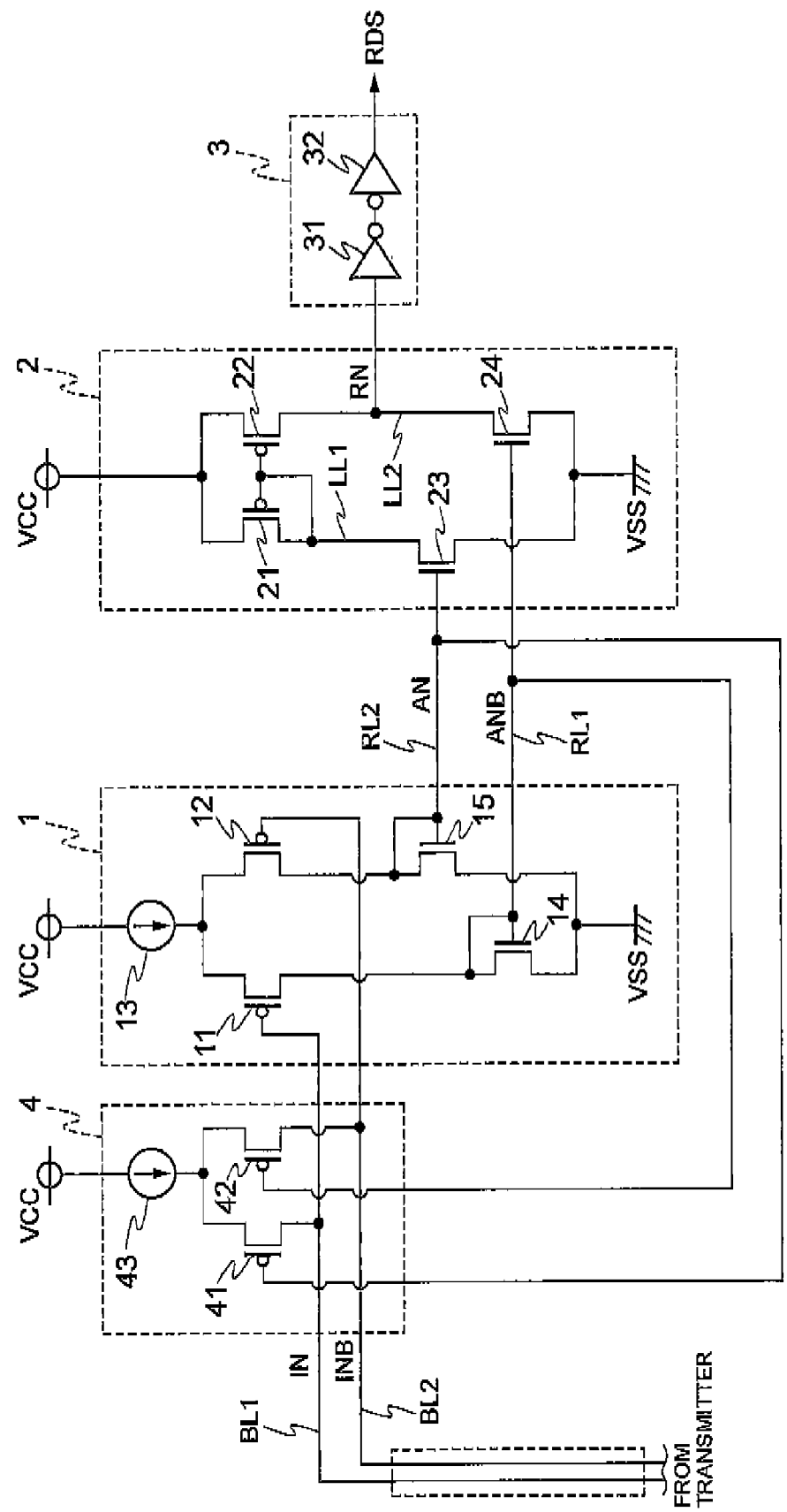
FIG. 6 is a circuit diagram showing a further modification of the data receiving circuit shown in FIG. 1.

FIG. 6 is a circuit diagram showing a modification of the data receiving circuit shown in FIG. 1 implemented in view of the point described above.

In the data receiving circuit shown in FIG. 6, the gate terminal of the transistor 42 of the amplitude controlling part 4 is connected to the relay line RL1, and the gate terminal of the transistor 41 of the amplitude controlling part 4 is connected to the relay line RL2. In other aspects, the configuration of the data receiving circuit is identical with that shown in FIG. 1.

The amplitude controlling part 4 shown in FIG. 6 supplies to the balanced transmission line (BL1, BL2) a current such that the lower the level of the differential amplitude signal AN(ANB), the larger the current, so that the lower the level of the differential amplitude signal AN (ANB), the greater the rise of the level of the received differential signal IN (INB), thereby to decrease the amplitude of the received differential signal IN (INB). As a result, like in the configuration shown in FIG. 1, the amplitudes of the differential amplitude signal AN (ANB) and the data signal RN (RNB) can be limited, in the configuration shown in FIG. 6, by the amplitude controlling part 4 to values equal to or lower than the upper limit amplitude $AP_{MAX}$ which assures high speed operation.

As in the configuration shown in FIG. 3, it is also possible to provide a delay circuit immediately before the gate terminal of the transistor 42 (41) of the amplitude controlling part 4 in the configuration shown in FIG. 6.

Figure 7:
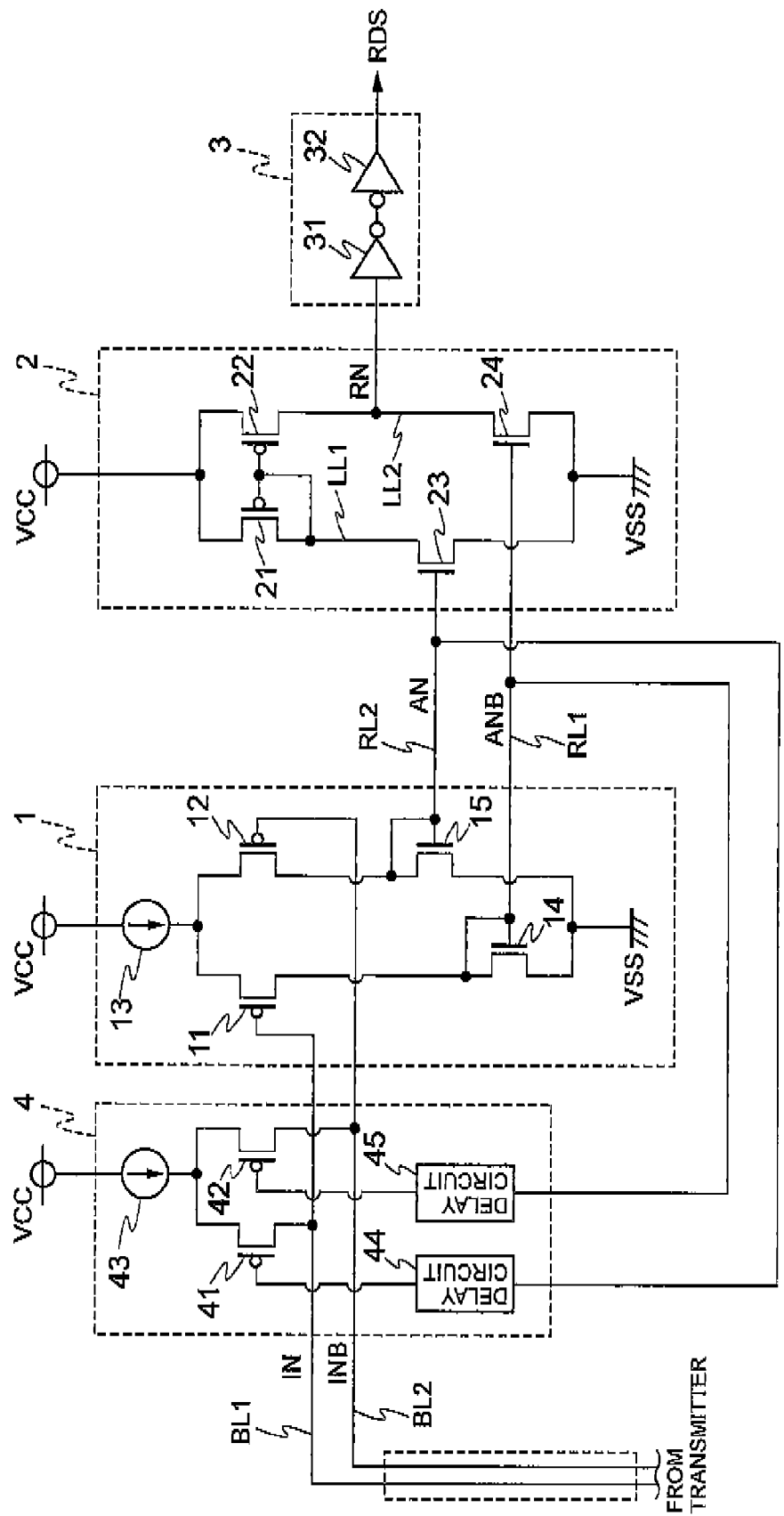
FIG. 7 is a circuit diagram showing a modification of the data receiving circuit shown in FIG. 6.

FIG. 7 is a circuit diagram showing a modification of the data receiving circuit shown in FIG. 6 implemented in view of the point described above.

The data receiving circuit shown in FIG. 7 is identical with that shown in FIG. 6 other than a point that the delay circuit 44 (45) is provided between the relay line RL1 (RL2) connecting the differential amplification stage 1 and the level converting stage 2 and the gate terminal of the transistor 42 (41) of the amplitude controlling part 4.

Briefly speaking, the present invention features that an amplitude control part (4) is provided in a data receiving circuit including an amplification processing stage (differential amplification stage 1) that performs an amplification processing on a received data signal (IN, INB) to obtain an amplified data signal (AN, ANB) and transmits the obtained amplified data signal (AN, ANB), and a level converting processing stage (level converting stage 2) that performs a level converting processing on the amplified data signal (AN, ANB) to obtain a level converted data signal (RN, RNB) and transmits the obtained level converted data signal (RN, RNB).

As shown in FIGS. 1 and 3 to 7, the amplitude controlling part (4) feeds back the increase or decrease of the level of one of the amplified data signal (AN, ANB) and the level converted data signal (RN, RNB) that is transmitted from one of the amplification processing stage (1) and the level converting processing stage (2) (hereinafter, referred to "one processing stage") to a stage preceding the one processing stage. Stated differently, the increase or decrease of the level is fed back to a point upstream of the aforementioned one processing stage as shown in FIGS. 1 and 3 to 7.

Figure 8:
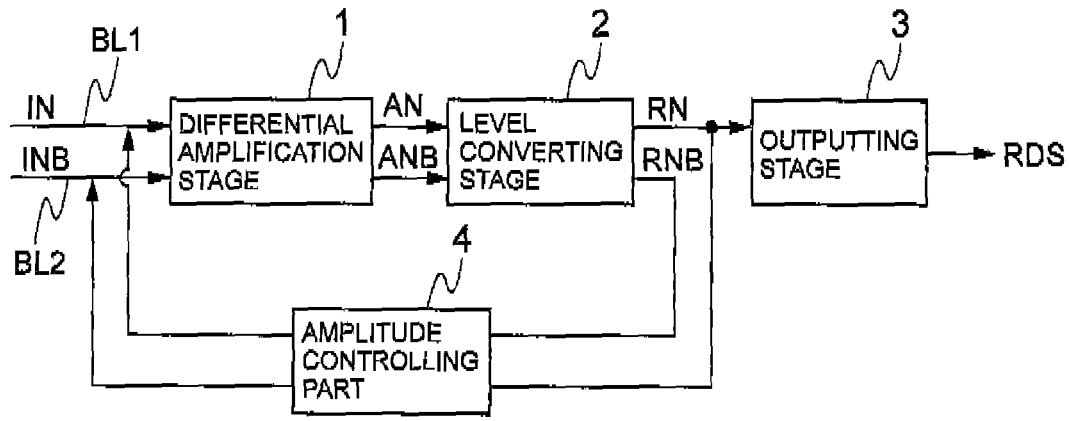
FIG. 8 is a block diagram schematically showing the configuration of the circuits shown in FIGS. 1 and 3 to 7.
Figure 9:
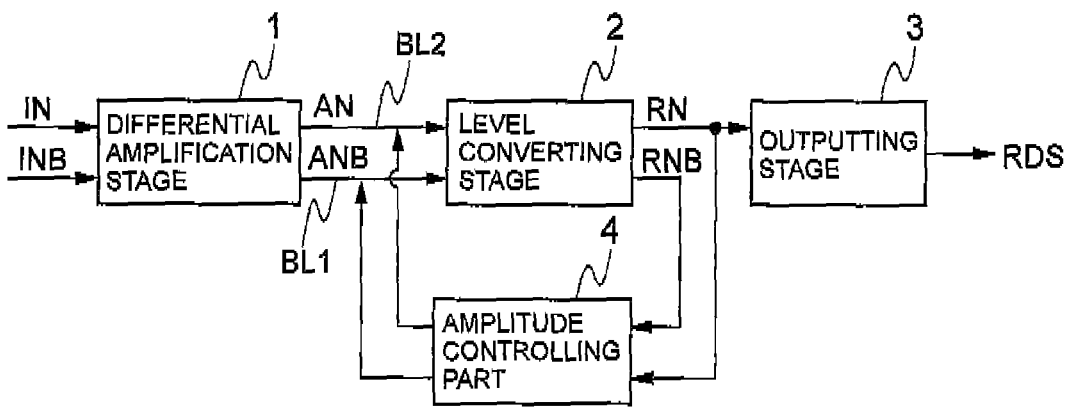
FIG. 9 is a block diagram schematically showing the configuration of the circuits shown in FIGS. 1 and 3 to 7.
Figure 10:
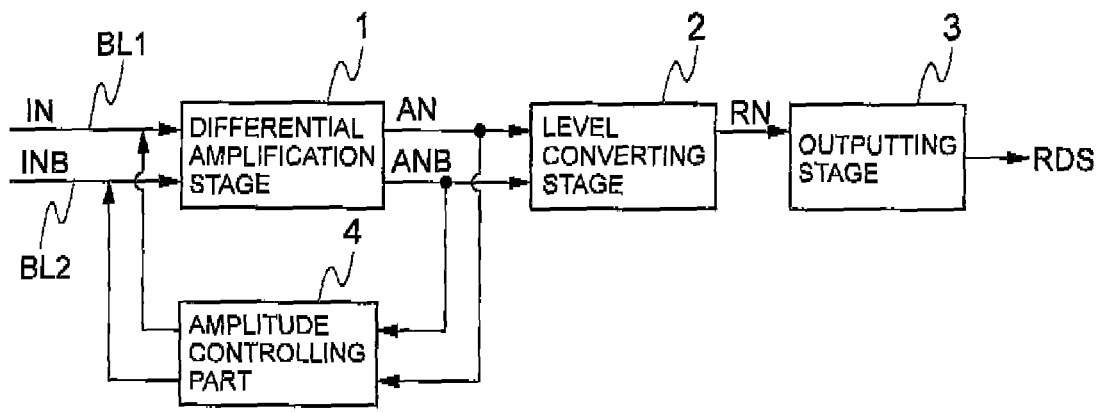
FIG. 10 is a block diagram schematically showing the configuration of the circuits shown in FIGS. 1 and 3 to 7.

In the configurations shown in FIGS. 1 and 3, for example, the increased or decreased portion of the level of the level converted data signal (RN RNB) transmitted from the level converted processing stage (2) is reflected in the received data signal (IN, INB) by the amplitude controlling part (4) as illustrated in FIG. 8. Similarly, in the configurations shown in FIGS. 4 and 5, the increased or decreased portion of the level of the level converted data signal (RN RNB) transmitted from the level converted processing stage (2) is reflected in the amplified data signal (AN, ANB) by the amplitude controlling part (4) as illustrated in FIG. 9. In the configurations shown in FIGS. 6 and 7, the increased or decreased portion of the level of the amplified data signal (AN ANB) transmitted from the amplification processing stage (1) is reflected in the received data signal (IN, INB) by the amplitude controlling part (4) as illustrated in FIG. 10.

With this feature, the lower the level of the signal transmitted from the aforementioned one processing stage, the higher in increase of the level of the signal supplied to the aforementioned one processing stage or the amplitude level of the received data signal. Thus, by operation of the amplitude controlling part (4), the larger the amplitude of the internal signal (IN, INB, AN, ANB) of the data receiving circuit, the greater in decrease of its amplitude, so that the amplitude can be controlled to be equal to or lower than the upper limit amplitude that assures high speed operation. Accordingly, in accordance with the present invention, even if the amplitude of the signal in the data receiving circuit is increased to be greater than the upper limit amplitude which can assure high-speed operation as a result of manufacturing dispersion, the amplitude of the signal can be controlled within the upper limit amplitude. This allows an accurate acquisition of a data signal corresponding to information data from a signal transmitted at high-speed and high-density.

Figure 11:
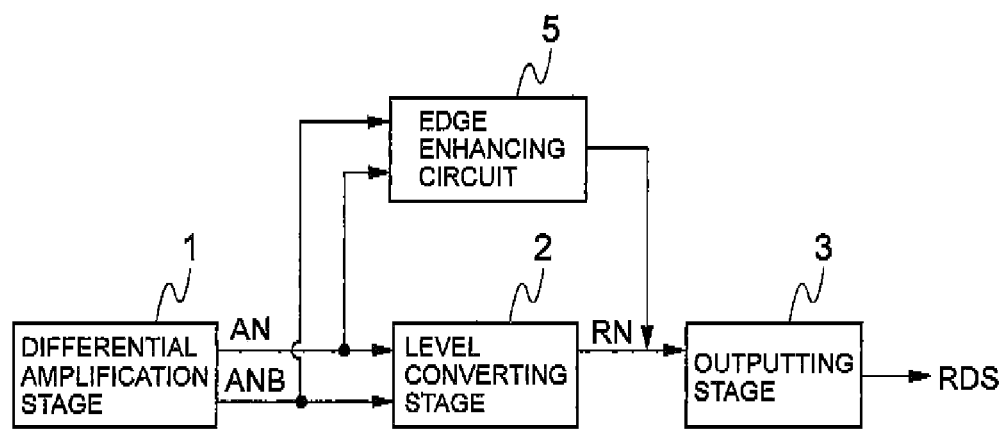
FIG. 11 is a block diagram schematically showing the connection configuration of the circuit when an edge enhancing circuit 5 is provided.
Figure 12:
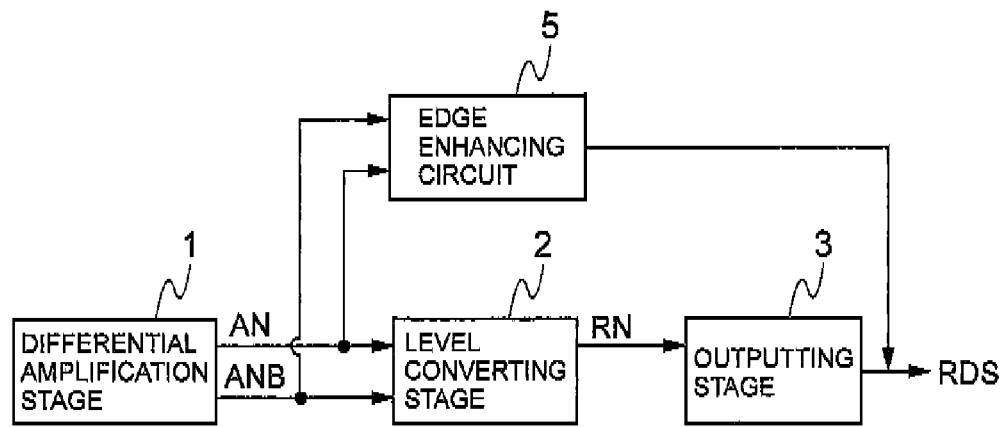
FIG. 12 is a block diagram schematically showing the connection configuration of the circuit when an edge enhancing circuit 5 is provided.

Furthermore, the data receiving circuits shown in FIGS. 1 and 3 to 7 may be provided with an edge enhancing circuit that steepens the level transition over time of the level converted data signal RN or RDS at the rising and falling edge portions (simply refereed to as "edge portions" hereinafter) of its signal level. For example, as shown in FIG. 11, an edge enhancing circuit 5 that steepens the level transition at the edge portions of the data signal RN in accordance with the amplified data signal (AN, ANB) is provided in the data receiving circuits shown in FIGS. 1 and 3 to 7. Alternatively, as shown in FIG. 12, the edge enhancing circuit 5 that steepens the level transition at the edge portions of the data signal RDS in accordance with the amplified data signal (AN, ANB) is provided in the data receiving circuits shown in FIGS. 1 and 3 to 7. It is to be noted that the amplitude controlling part 4 is not shown in FIGS. 10 and 12.

Figure 13:
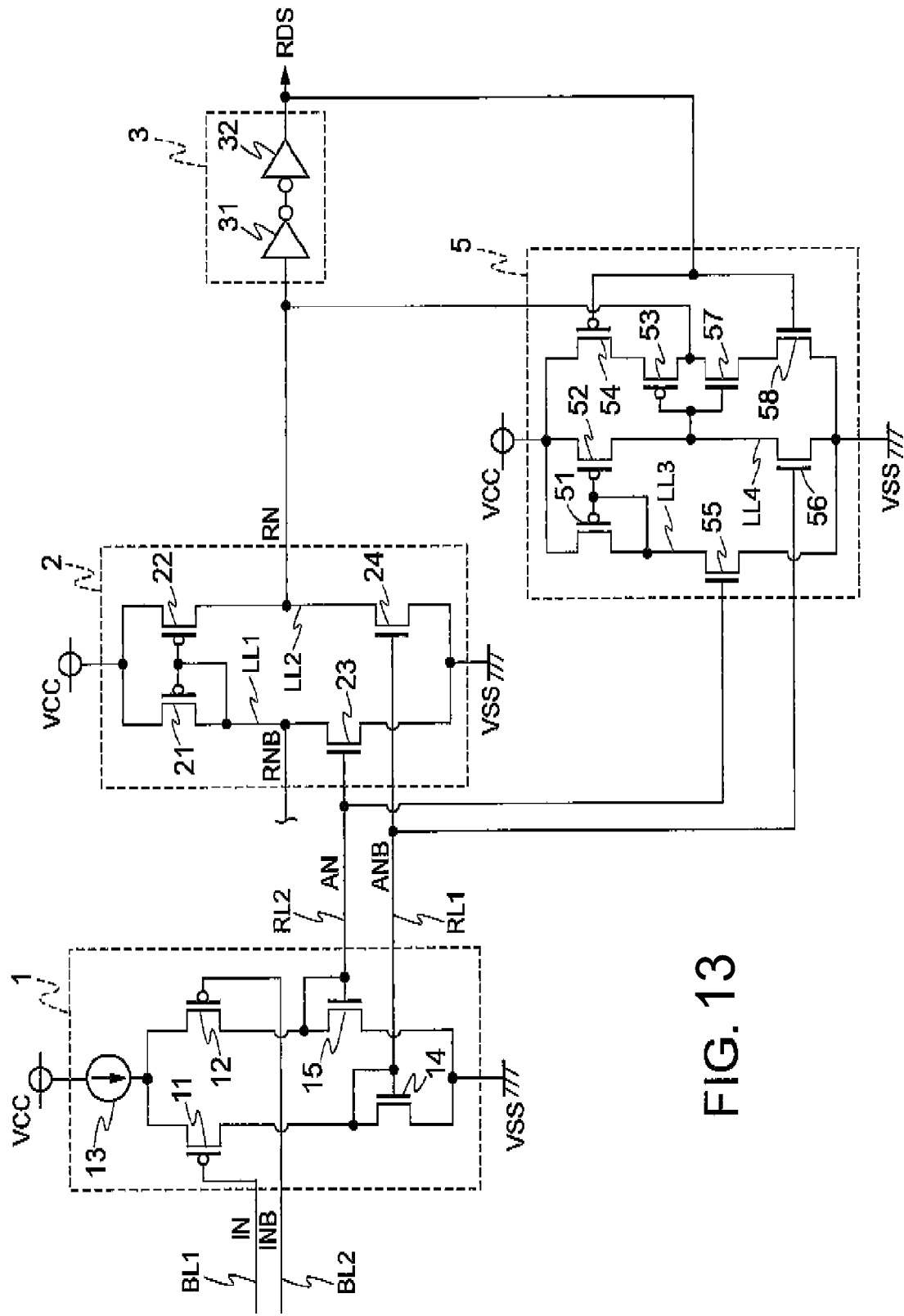
FIG. 13 is a circuit diagram showing an example of the connection configuration of the circuit when the edge enhancing circuit 5 is provided.

FIG. 13 is a circuit diagram showing an internal configuration of the edge enhancing circuit 5.

In FIG. 13, the internal configurations of the differential amplification stage 1, the level converting stage 2, and the outputting stage 3 are the same as those shown in FIG. 1.

As illustrated in FIG. 13, the edge enhancing circuit 5 includes p-channel MOS transistors 51 to 54 and n-channel MOS transistors 55 to 58. The edge enhancing circuit 5 is made up of a level converting part including the above-described transistor 51, 52, 55 and 56 and a buffering part including the above-described transistors 53, 54, 57 and 58.

The power voltage VCC is supplied to the source terminals of the transistors 51 and 52, and the gate terminals of these transistors 51 and 52 are mutually connected. The gate terminal and the drain terminal of the transistor 51 is connected to the drain terminal of the transistor 55 via the line LL3. The differential amplified signal AN supplied from the differential amplification stage 1 via the relay line RL2 is supplied to the gate terminal of the transistor 55, and the ground potential VSS is supplied to its source terminal. The drain terminal of the transistor 52 is connected to the drain terminal of the transistor 56 via the line LL4. The differential amplified signal ANB supplied from the differential amplification stage 1 via the relay line RL1 is supplied to the gate terminal of the transistor 56, and the ground potential VSS is supplied to its source terminal. The power supply voltage VCC is supplied to the source terminal of the transistor 54. The drain terminal of the transistor 57 is connected to the drain terminal of the transistor 53 and also to the line LL2 which is the output line of the level converting stage 2. The source terminal of the transistor 57 is connected to the drain terminal of the transistor 58. The ground voltage VSS is supplied to the source terminal of the transistor 58 and its gate terminal is connected to the gate terminal of the transistor 54 and also to the output terminal of the inverter 32 of the outputting stage 3.

Figure 14:
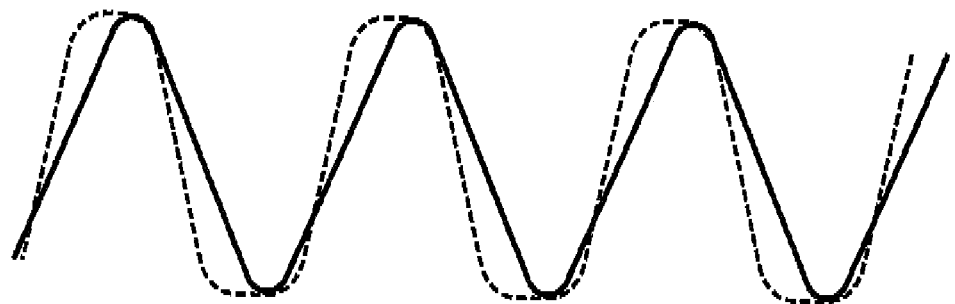
FIG. 14 is a waveform diagram showing an example of the edge enhancement of the signal level by the edge enhancing circuit 5.

The level converting portion (51, 52, 55 and 56) of the edge enhancing circuit 5 having the configuration described above supplies a level converted signal, that is obtained by converting the level of the amplified data signal (AN, ANB) to the level of the data signal RN, to the buffering part (53, 54, 57 and 58) via the line LL4. When the signal level on the line LL4 is at the low level, only the transistor 53 between the transistors 53 and 57 of the buffering part turns on, so that the power supply voltage VCC is applied to the above-described line LL2 via the transistors 53 and 54. Conversely, when the signal level on the line LL4 is at the high level, only the transistor 57 between the transistors 53 and 57 of the buffering part turns on, so that the ground potential GND is applied to the above-described line LL2 via the transistors 57 and 58. Thus, the buffering part of the edge enhancing circuit 5 supplies a relatively large current, that corresponds to the amplified data signal (AN, ANB), to the line LL2. By this current supply, the level transition over time at the edge portions of the data signal RN on the line LL2 steepens as compared with the case where the edge enhancing circuit 5 is not provided. For example, the solid line of FIG. 14 shows a waveform of the data signal RN when the edge enhancing circuit 5 is not provided, and the dashed line of FIG. 14 shows a waveform of the data signal RN when the edge enhancing circuit 5 is provided.

In this way, the edge enhancing circuit 5 steepens the level transition over time at the rising and falling edge portions of the data signal RN by supplying the current according to the amplified data signal (AN, ANB) to the line LL2 that is the output line of the level converting stage 2.

It is to be noted that the transmission of an excessive current is prevented in the buffer portion of the edge enhancing circuit 5 by driving the transistors 54 and 58 to an off-state in accordance with the level of the data signal RDS.

It is possible to reduce the amount of a parasitic load on the line LL2 of the level converting stage 2 by providing the above-described edge enhancing circuit 5 in the configurations shown in FIGS. 8 and 9.

Figure 15:
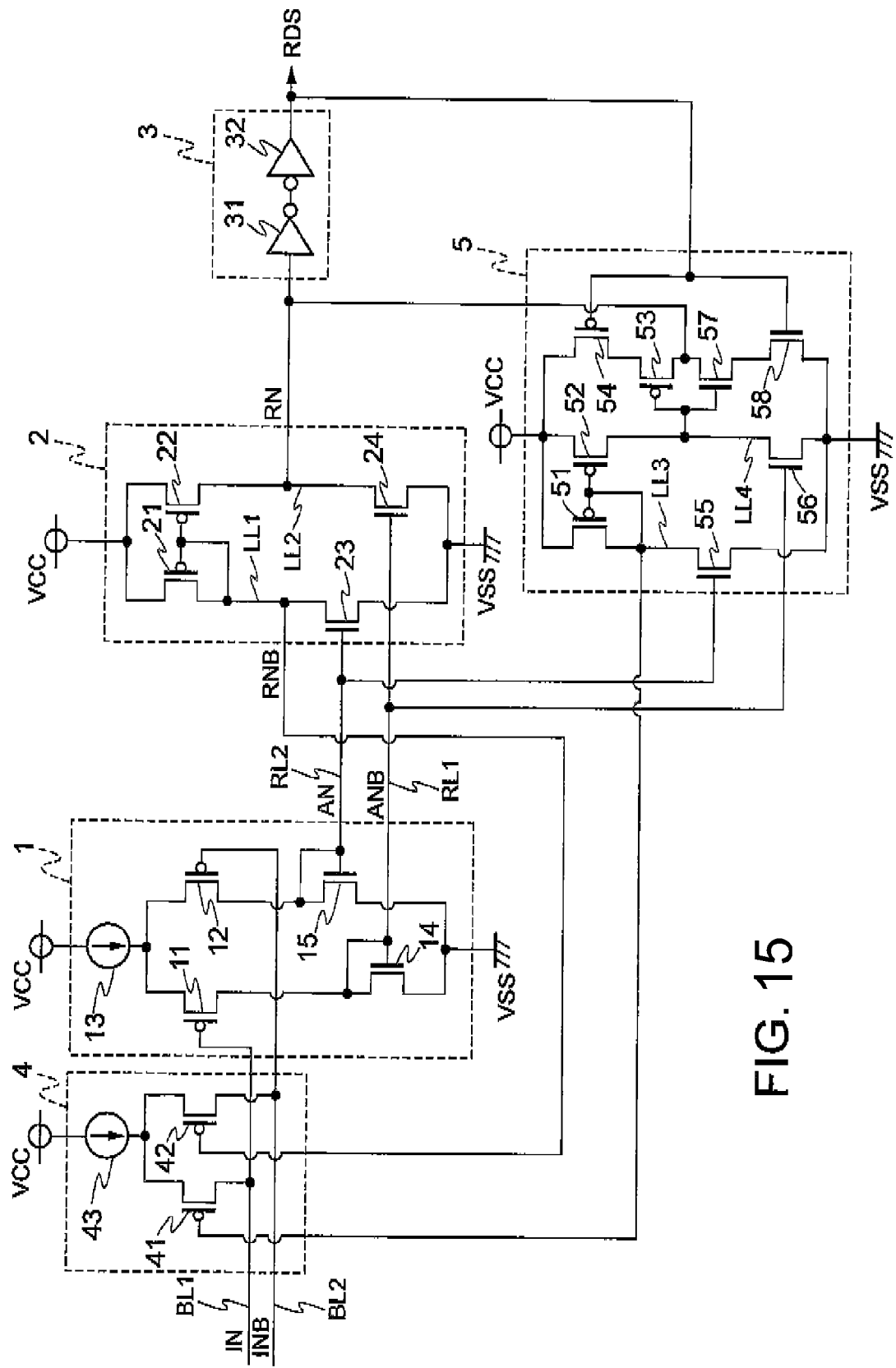
FIG. 15 is a circuit diagram showing an example of the connection configuration of the circuit when the edge enhancing circuit 5 is provided.

For example, when the edge enhancing circuit 5 is provided as illustrated in FIG. 15 in the configuration shown in FIG. 8, the gate terminal of the transistor 42 of the amplitude controlling part 4 is connected to the line LL1 of the level converting stage 2 as in the configurations shown in FIGS. 1, 3 to 5. However, the gate terminal of the transistor 41 of the amplitude controlling part 4 is not connected to the line LL2 of the level converting stage 2 but connected to the line LL3 that is the output line of the level converting part of the edge enhancing circuit 5. With this configuration, the increase or decrease of the level of the signal transmitted to the output line LL3 of the level converting part of the edge enhancing circuit 5, that is the same as the level of the level converted data signal, is fed-back to the stage preceding the amplification processing stage (1).

Thus, according to the configuration shown in FIG. 15, the gate terminal of the transistor is not connected to the line LL2 that is the transmission line of the data signal RN, so that the amount of the parasitic load on the line LL2 can be reduced as compared with the configurations shown in FIGS. 1 and 3-5 in which the gate terminal of the transistor 42 of the amplitude controlling part 4 is connected to the line LL2.

This application is based on Japanese Patent Application No. 2012-069681 which is incorporated herein by reference.

What is claimed is:

1. A data receiving circuit comprising:
an amplification processing stage that supplies an amplified data signal on a first line, said amplified data signal being obtained by performing an amplification process on a received data signal; and
a level converting processing stage that transmits a level converted data signal via a second line, said level converted data signal being obtained by performing a level conversion processing on said amplified data signal,
wherein said data receiving circuit further comprises an amplitude controlling part that feeds back an increase or decrease of one of said amplified data signal and said level converted data signal transmitted from one of said amplification processing stage and said level converting processing stage to a stage preceding said one of said amplification processing stage and said level converting processing stage,
wherein said amplitude controlling part is configured to change a level of said received data signal or a data signal supplied to either one of said amplification processing stage and said level converting processing stage so that the lower an instantaneous level of another data signal transmitted from either one of said amplification processing stage and said level converting processing stage is, the larger an increase amount of an instantaneous level of said received data signal or the data signal supplied to either one of said amplification processing stage and said level converting processing stage is.

2. The data receiving circuit according to claim 1, wherein said received data signal is one of a pair of differential signals, and said amplification processing stage performs a differential amplification process.

3. The data receiving circuit according to claim 1, further comprising an edge enhancing circuit that steepens a level transition over time of said level converted data signal at rising and falling edges of said level converted data signal by supplying a current corresponding to said amplified data signal to said second line.

4. The data receiving circuit according to claim 2, further comprising an edge enhancing circuit that steepens a level transition over time of said level converted data signal at rising and falling edges of said level converted data signal by supplying a current corresponding to said amplified data signal to said second line.

5. The data receiving circuit according to claim 3, wherein said edge enhancing circuit comprises a level converting part that transmits a signal having a level the same as the level of said level converted data signal to an output line and a buffering part that supplies a current according to a signal on said output line to said second line, wherein said amplitude controlling part feeds back the increase or decrease of a signal having a level the same as the level of said level converted data signal to said stage preceding said one of said amplification processing stage and said level converting processing stage.

6. The data receiving circuit according to claim 4, wherein said edge enhancing circuit comprises a level converting part that transmits a signal having a level the same as the level of said level converted data signal to an output line and a buffering part that supplies a current according to a signal on said output line to said second line, wherein said amplitude controlling part feeds back the increase or decrease of a signal having a level the same as the level of said level converted data signal to said stage preceding said one of said amplification processing stage and said level converting processing stage.

7. A data receiving method that generates a level converted data signal by performing, at a level converting processing stage, a level conversion process on an amplified data signal obtained by performing, at an amplification processing stage, an amplification on a received data signal,
   wherein an increase or decrease of one of the amplified data signal and the level converted data signal is fed-back to a preceding stage,
   wherein said received data signal or a data signal supplied to either one of said amplification processing stage and said level converting processing stage is changed in level so that the lower an instantaneous level of another data signal transmitted from either one of said amplification processing stage and said level converting processing stage is, the larger an increase amount of an instantaneous level of said received data signal or the data signal supplied to either one of said amplification processing stage and said level converting processing stage is.

* * * * *